United States Patent [19]
Njinda et al.

[11] Patent Number: 6,080,203
[45] Date of Patent: Jun. 27, 2000

[54] APPARATUS AND METHOD FOR DESIGNING A TEST AND MODELING SYSTEM FOR A NETWORK SWITCH DEVICE

[75] Inventors: Charles Akum Njinda, San Jose; Somnath Viswanath, Sunnyvale, both of Calif.

[73] Assignee: Advanced Micro Devices, Inc., Sunnyvale, Calif.

[21] Appl. No.: 08/992,798

[22] Filed: Dec. 18, 1997

Related U.S. Application Data

[60] Provisional application No. 60/038,025, Feb. 14, 1997.

[51] Int. Cl.$^7$ ..................................................... G06F 17/50
[52] U.S. Cl. ..................... 716/4; 716/7; 716/8; 703/14; 703/17; 703/20
[58] Field of Search ........................... 395/506; 371/22.1; 716/4, 7, 8, 17; 703/14, 17, 20

[56] References Cited

U.S. PATENT DOCUMENTS

| | | | |
|---|---|---|---|
| 5,515,376 | 5/1996 | Murthy et al. | 370/402 |
| 5,684,808 | 11/1997 | Valind | 1/1 |
| 5,862,149 | 1/1999 | Carpenter et al. | 395/500.05 |

OTHER PUBLICATIONS

Kawaguchi et al, "A RTL Partitioning Method with a Fast Min–Cut Improvement Algorithm", IEEE Proceedings of the ASP–DAC '97 Asia and South Pacific Design Automation Conference, pp. 57–60, Jan. 1997.

Fang et al, "A Hierarchical Functional Structuring and Partitioning Approach for Multiple–FPGA Implementations", 1996 IEEE/ACM International Conference on Computer–Aided Design, pp. 638–643, Nov. 1996.

Hosokawa et al, "A Design for Testability Method Using RTL Partitioning", IEEE Proceedings of the Fifth Asian Test Symposium, pp. 88–93, Nov. 1996.

*Primary Examiner*—Kevin J. Teska
*Assistant Examiner*—Samuel Broda

[57] ABSTRACT

An arrangement for designing a testing modeling system provides a testing hierarchy, where non-standard device elements having internal memory and logic structures are modeled by partitioning the device element into a recognizable memory model and a recognizable logic model separate from the memory model. The segregated models are then verified for accuracy using existing design and simulation tool and with comparison to existing hardware implementations. Once the revised models have been verified, the new models can be stored in a model library for future use.

8 Claims, 9 Drawing Sheets ic # APPARATUS AND METHOD FOR DESIGNING A TEST AND MODELING SYSTEM FOR A NETWORK SWITCH DEVICE

RELATED APPLICATIONS

This application claims priority from provisional patent application Ser. No. 60/038,025, filed Feb. 14, 1997, entitled INTEGRATED MULTIPORT SWITCH, which is incorporated herein by reference.

BACKGROUND OF THE INVENTION

1. Technical Field

The present invention relates to simulation and testing methodology, more specifically to apparatus and methods for designing simulation models for use in designing and testing complex devices, such as network switch devices.

2. Background Art

Switched local area networks use a network switch for supplying data frames between network stations, where each network station is connected to the network switch by a media. The switched local area network architecture uses a media access control (MAC) enabling a network interface within each network node (including the switch) to access the media.

An important consideration in the design and implementation of complex device structures, such as a network switch implemented on an integrated circuit, involves the methodology used for designing and testing the complex device structure. Specifically, the functionality of a complex device is often enhanced with test structures or stored test routines in order to determine whether the manufactured device will work for its intended purpose. Although designing a device testability is not strictly an essential component for device operability, early design and implementation of device testability provides more efficient resources for debugging device prototypes, identifying and locating manufacturing defects in the device, as well as identifying failures that may occur in the device over time due to other hardware or software.

Different computer aided design and simulation systems have been developed to assist circuit designers in simulating circuit design and performance prior to reduction to silicon. For example, a design tool known as the Mentor Fastscan, manufactured by Mentor Graphics, Inc., has a modeling technique where enabling simulation of basic circuit components, for example, a basic random access memory (RAM). Although the Mentor Fastscan tool is capable of modeling a block of custom logic or a RAM or a ROM, the above-described system is unable to model more complex structures, where a device may have state-dependent units implemented on the device. For example, a logic array composed of logic arrays and memory components having multiple states may need to be modeled by counting the number of memory elements (e.g., flip-flops). Accurate modeling of such a complex logic array may require generating a permutation of models corresponding to an exponential number ($2^N$) of the memory elements, where N equals the number of memory elements. Alternatively, the array may be modeled by the modeling tools as a black box, where the internal structure of the array is not known to the tool. In this case, any logic driving the array or driven by the array would be untestable, since faults in the logic driving the array would be unobservable, and faults in the logic driven by the array would be uncontrollable.

DISCLOSURE OF THE INVENTION

There is a need for an arrangement for testing a device, where complex devices having logic components integrated with memory components may be accurately modeled for device testability design and simulation modeling.

There is also a need for an arrangement for modeling a device design, where imbedded logic in a device may be segregated and tested in an efficient manner that provides reliable testing analysis with minimal design time.

These and other aspects are obtained by the present invention, where a nonstandard device element having integral memory and logic structure is modeled by partitioning into a recognizable memory model and a recognizable logic model separate from the memory model, enabling verification and testing using existing design and simulation tools.

According to one aspect of the present invention, a method for testing a device includes modeling a device design based on a prescribed hierarchy used by a test pattern generation system, the device design including a register file comprising a memory portion and an associated logic portion integral with the memory portion, the modeling step including partitioning the register file to create a model of the register file having a memory model recognizable by the test pattern generation system and having an accessible input and an accessible output, and a logic model separate from the memory model, verifying the model of the register file as an accurate representation of the register file based on prescribed test patterns, and storing the verified model of the register file in the test pattern generation system. The partitioning of the register file to create the model having the memory model and the separate logic model enables the use of existing simulation and test design tools having relatively simple model systems for design and simulation. Moreover, the storing of the verified model enables existing test pattern generation systems, as well as simulation systems, to provide design capabilities for more advanced systems by building a library of the model relationships of the more complex register file structures relative to the basic memory models and logic models recognizable by the test pattern generation system.

Another aspect of the present invention provides a system comprising a test pattern generation system configured for generating test vectors for selected models, the test pattern generation system having a model library configured for storing memory models of respective predetermined memory components and logic models of prescribed logic circuits, respectively, a modeling tool configured for modeling a device design of a hardware device, the device design including a register file representing an addressable register in the hardware device, the register file having integrally associated logic, wherein the modeling tool is configured to partition the register file to create a model of the register file having a memory model recognizable by the test pattern generation system and having an accessible input and an accessible output, and a logic model separate from the memory model, the modeling tool storing the model of the register file in the model library for generation of respective test vectors by the test pattern generation system. Use of the modeling tool to create a model of the register file by partitioning the associated memory and logic components enable the capabilities of the test pattern generation system to be enhanced by adding the model of the register file to the model library. Moreover, the test pattern generation system can generate advanced test vectors for the stored model of the register file to provide advanced testing of selected portions of the device.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for testing a device by partitioning memory models according to the present invention. It will become apparent, however, that the present invention is also applicable to other packet switched systems, as described in detail below.

Switch Architecture

Figure 1:
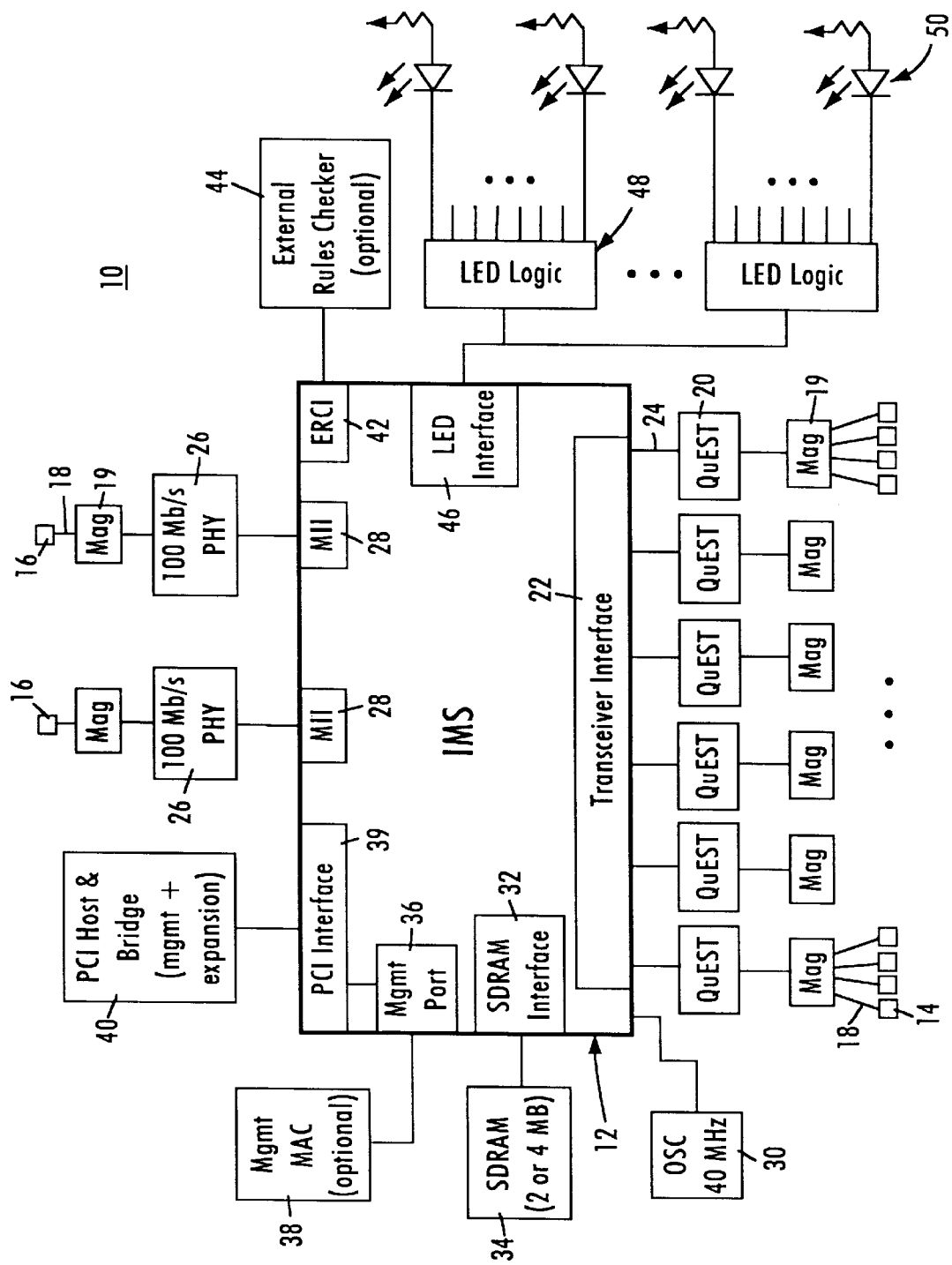
FIG. 1 is a block diagram of a packet switch system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission. If desired, the 10 Mb/s network stations may also be configured to operate in full-duplex mode.

The 100 Mb/s network stations 16 preferably operate in fall-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of pins required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. As described in detail below, the management port 36 outputs management frames having at least a portion of a selected received data packet and new information providing management information. The multiport switch 12 also includes a PCI interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
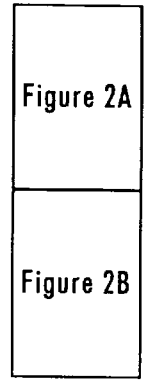
FIG. 2 is a block diagram of a multiport switch constructed in accordance with an embodiment of the present invention and used in the packet switch system of FIG. 1.
Figure 2A:
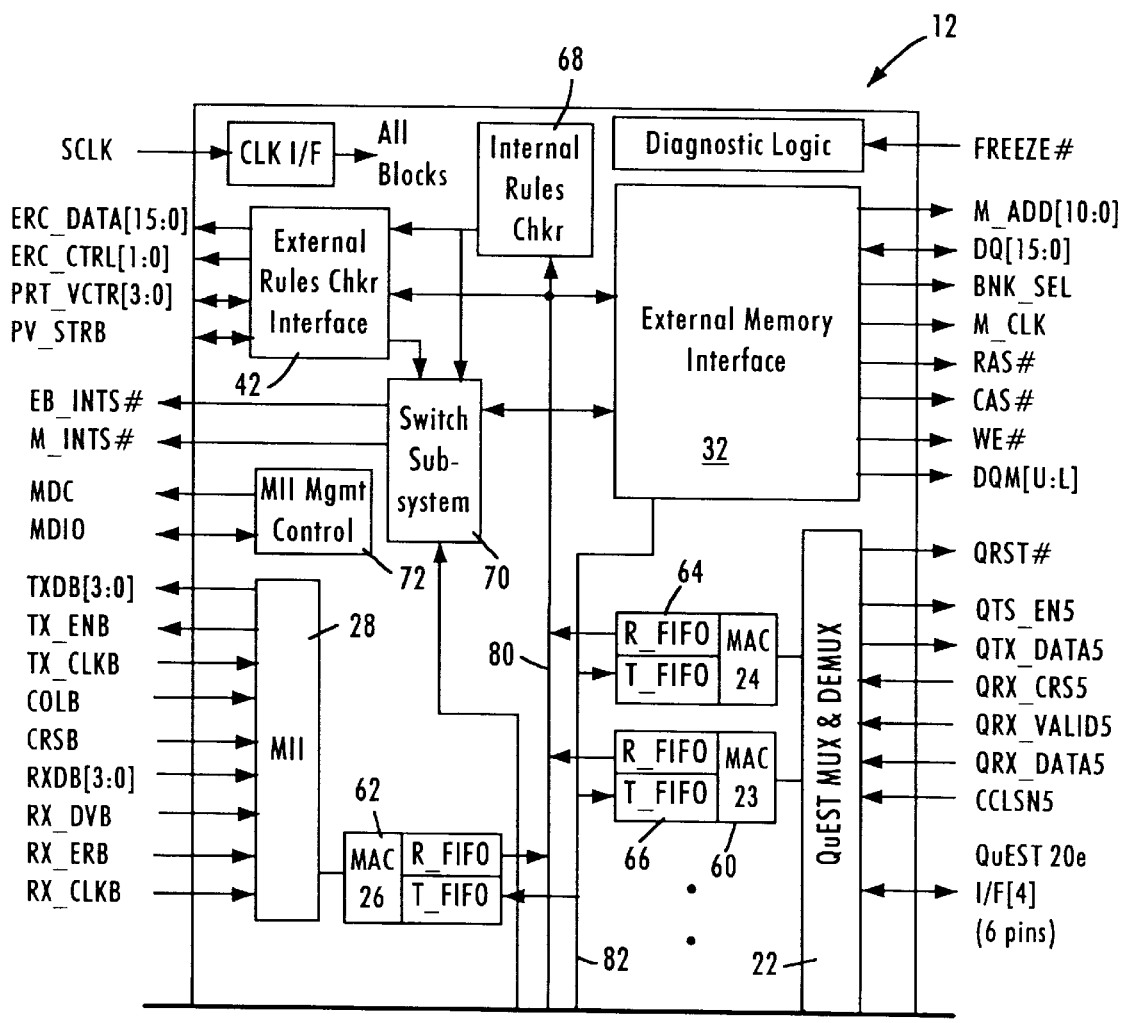
Figure 2B:
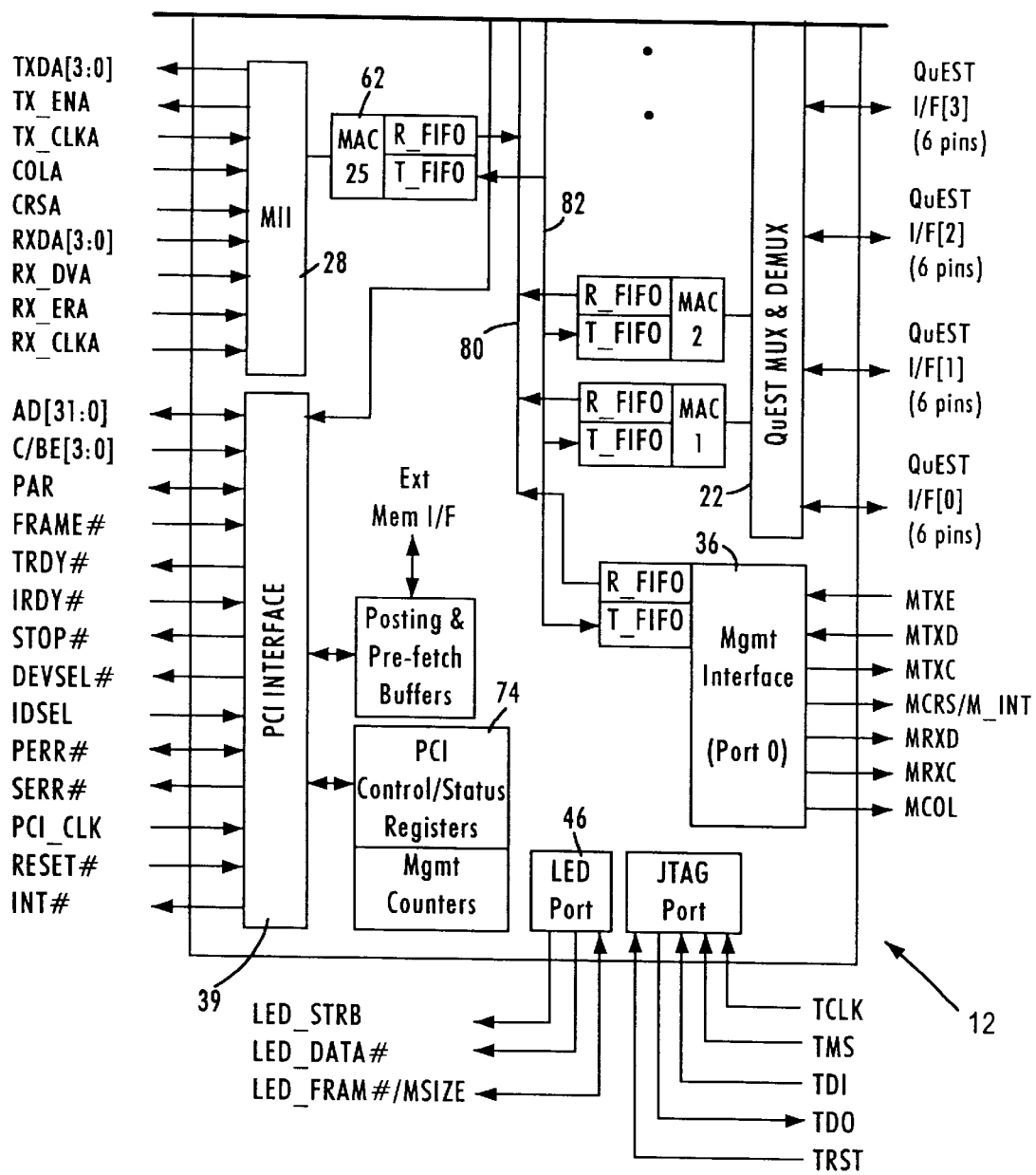

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Designing Models For Test Pattern Generation

According to the disclosed embodiment, the multiport switch 12 is designed with device structures and associated computer simulation and modeling systems that enable the multiport switch to be designed and manufactured with diagnostic structures and routines in order to test the device for proper operation. Two aspects of designing diagnostic routines and/or structures for the multiport switch 12 include providing a model of the device 12 that accurately represents the intended operation of the device 12. A second aspect of the diagnostic routine/structure includes developing a model that can be used by existing simulation and computer test system to accurately test whether a hardware implementation of the design (i.e., a circuit implementation reduced to silicon) accurately performs the intended functions.

Existing diagnostic systems are not adapted to perform diagnostic routines for the relatively complex architecture of the multiport switch 12, described above. According to the disclosed embodiment, design models simulating the operation of the multiport switch 12 are partitioned to enable lower level circuit simulation systems to accurately generate test vectors for simulation and diagnostic purposes.

Figure 3:
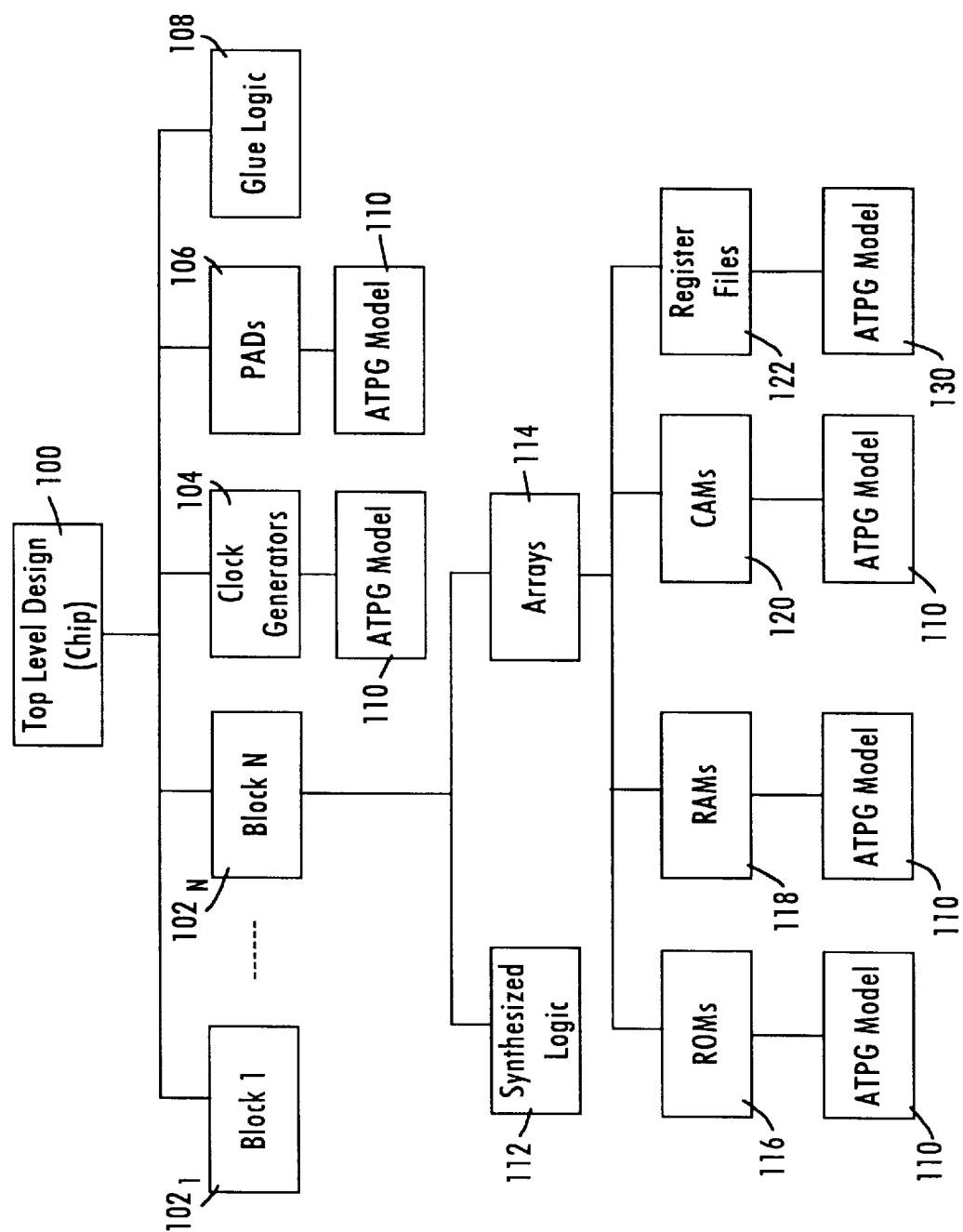
FIG. 3 is a diagram illustrating a design hierarchy for developing a modeling system for testing the network switch of FIGS. 1 and 2 according to an embodiment of the present invention.

FIG. 3 is a diagram illustrating a test view hierarchy of the multiport switch 12. In order for the top level design 100 to be testable, it is desirable that all the lower blocks that make up the top level design 100 should also be testable. For example, the top level design 100 will typically include a number of design block 102 that simulate performance of a particular operation. For example, block $102_1$ may represent operation of the external memory interface 32. Another block $102_2$ may represent operation of the PCI bus interface 39 and associated control and configuration registers. Still another block 102 may represent operation of the management counters (e.g., MIB counters), described above. Still another block $102_N$ may represent operations of the FIFO Subsystems 64 and 66 associated with the MAC layers 60 and 62. Other exemplary blocks 102 may include the IRC 68 or ERCI 42, or management control functionality associated with the MII interfaces 28.

As shown in FIG. 3, the blocks 102 represent basic functional components of the multiport switch 12. The top level design also relies on a clock generator model 104, PAD logic 106 and a representation of glue logic 108. Each of the models 104 and 106 have associated reference models 110 that are recognizable by an automatic test pattern generation (ATPG) system. One example of an ATPG system is the Mentor Fastscan tool, manufactured by Mentor Graphics, Inc. As shown in FIG. 3, ATPG models 110 exist for the clock generator model 104 and the PAD model 106, but not for the glue logic 108. As recognized in the art, the glue logic model 108 represents non-standard logic used to synchronize different functional components. Hence, glue logic should be avoided, if possible, and combined with the logic of other subblocks to make timing characterization and testability analysis easier.

Figure 5:
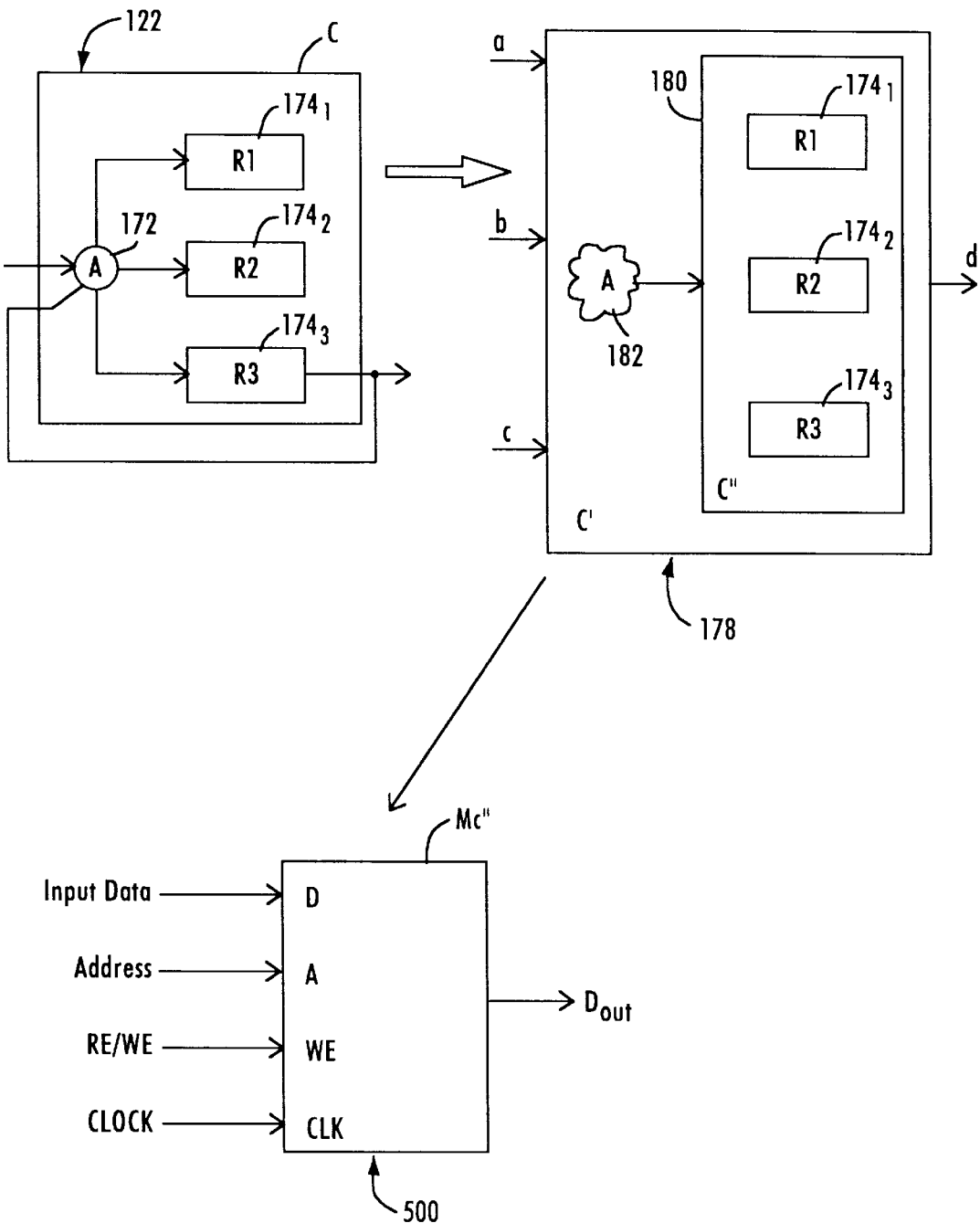
FIG. 5 is a diagram illustrating a method of modeling a device design by partitioning a register file according to an embodiment of the present invention.

As shown in FIG. 3, a particular block 102 (e.g., block N) may have its own set of associated lower level component that require accurate modeling and testability to insure full and accurate testability of the block N 102. For example, the block N 102 may include lower level operations associated with synthesized logic 112 (e.g., programmable logic arrays (PLA)), and memory arrays 114. As shown in FIG. 3, more detailed (i.e., lower level) representations of arrays 114 include read only memory (ROM) 16, random access memories (RAMs) 118, content addressable memories (CAMs) 120, and register file 122. Arrays implemented by ROMs, RAMs or CAMs can be easily represented using an ATPG model 110. For example, FIG. 5 illustrates an ATPG model 500 that provides the basic requirements for characterizing a model of a RAM. However, the register files 122 are not readable by existing diagnostic systems, as the register files 122 include both memory operations and logic operations.

Figure 4A:
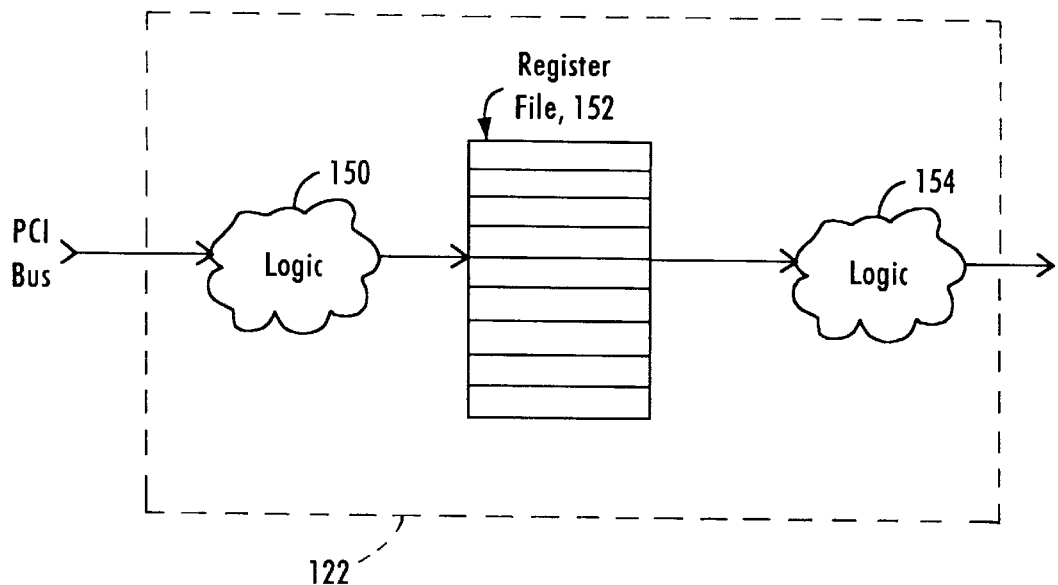
FIGS. 4A and 4B are diagrams illustrating register files representing the configuration registers within the multiport switch of FIG. 2 and having a memory portion and an associated logic portion integral with a memory portion.

FIG. 4A is a diagram illustrating a model of a register file 122. The register file 122 may logically represent one of the PCI control/status registers 74 of FIG. 2. The register file 122 is addressable by the PCI interface 39 by either a direct address space or an indirect address space where real-time registers 132 (i.e., run time registers) are addressable in the direct I/O space on the PCI bus, whereas different registers such as the internal rules checker registers 134 and the control, status and diagnostic registers 136 are addressable in indirect I/O space.

Figure 9:
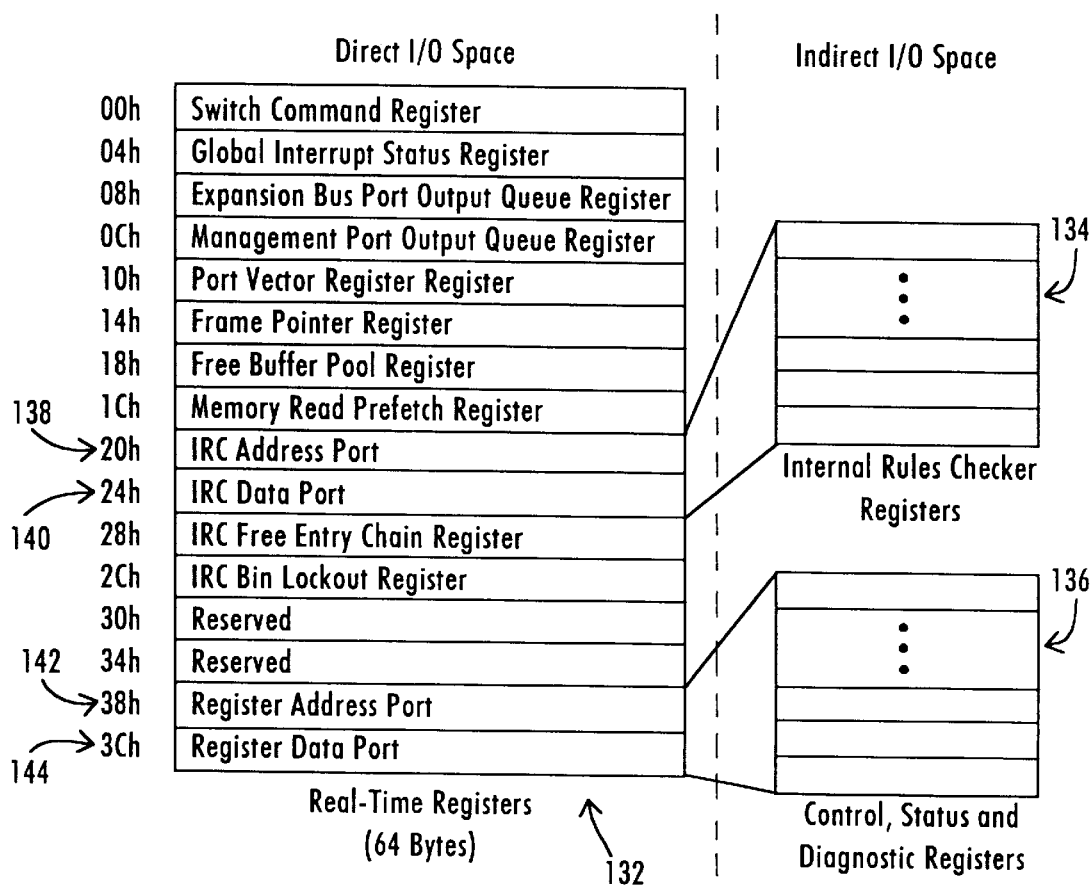
FIG. 9 is a diagram illustrating an addressing scheme of the PCI interface for the control/status registers for FIG. 2.

FIG. 9 is a diagram illustrating an addressing scheme of the PCI interface for the control/status registers of FIG. 2. As shown in FIG. 9, the real-time registers are addressable by direct addressing in the PCI address space, or as the registers 134 are accessible by indirect addressing, where the internal rules checker registers 134 are accessed via the IRC address port 138 at address 20$h$ and the IRC data port 140 at address 24$h$. The control, status and diagnostic registers 136 are addressed via a register address port 142 at address 38$h$ in the PCI address space, and a register data port 144 at address 3C$h$ in the PCI address space.

To access a selected one of the IRC registers 134, the PCI host writes the desired entry number (bits 16–24) and the desired register index (bits 1–2) into the IRC address port 138 (PCI Address 20 hexadecimal), and then reads/writes data from/to the IRC data port 140 (PCI Address 24$h$). Internal logic associated with the IRC rules checker registers 134 decode the value in the IRC address port 138 to read/write the appropriate data values into the IRC data port 140.

Similarly, the control, status and diagnostic registers 136 are required for configuration, processing interrupts and accessing external physical layer (PHY) devices, and diagnostic purposes. The registers 136 are also addressed using an index (address bits 15–8) and an offset (address bits 0–7), where a PCI host accesses a given register 136 by placing the register index of the offset into the register address port 142 (PCI Address 38$h$). Logic associated with the register address port 142 then decodes the address information, accesses the appropriate register 136, enabling the PCI host to read or write in the accessed register 136 by reading or writing into the register data port 144 (PCI Address 3C h).

The index-offset addressing scheme for accessing registers in indirect PCI space provides an efficient mechanism for accessing a large number of registers. As described above, however, such indirect addressing requires separate addressing logic to access the registers 134 and 136 in indirect I/O space.

Hence, the register file 122 of FIG. 4A represents one of the registers 134 or 136 and on a high level will simulate the operations of the indirect registers. However, representation on a component level (i.e., memory, logic, etc.) becomes more difficult, since logic and memory functions operate integrally. For example, the register file 122 includes a first logic portion 150, a memory portion 152 and a second logic portion 154. The logic 150 may correspond to address decoding logic for one of the address ports 138 or 142 to enable a PCI host to access a selected one of the register in the memory portion 152. The memory portion 152, which may be characterized as a plurality of registers in a predetermined address range or a random access memory, etc. has its own addressing, reading and writing requirements based upon the logic portion 150. The logic portion 154 may include address decoding logic for writing selected outputs to the data ports 140 and 144. Alternately, the logic 154 may be used to configure components of the multiport switch based upon the values stored in the register file 152.

Figure 4B:
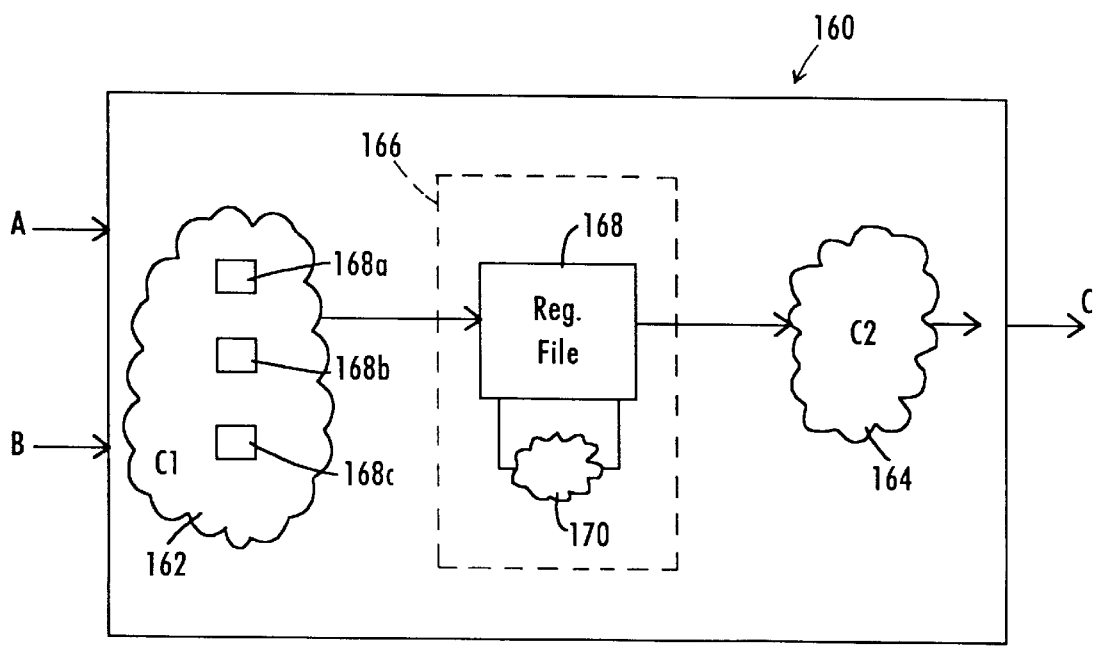

Hence, the register file 122 includes a memory portion 152 and associated logic portions 150 and 154 integral with the memory portion to provide state-dependent operations to be performed in the multiport switch 12. FIG. 4B is a diagram illustrating a more complex representation of a circuit 160 having an output C generated in response to inputs A and B. As shown in FIG. 4B, the circuit 160 includes combinational logic (C1) 162 and (C2) 164, and a register file 166 including a memory portion 168 and a logic portion 170 integral with the memory portion 168. In addition, the combinational logic C1 (162) may have its own internal logic components 168 that may have their own respective memory elements (e.g., flip-flops). Although the combined use of logic and memory component may be effective for implementation of a device having a complex architecture, such as the multiport switch 12, existing diagnostic systems are not adapted to perform diagnostic routines for such complex architectures. Rather, diagnostic systems such as the Mentor Fastscan by Mentor Graphics, Inc. have relatively simple ATPG models 110 to simulate operation of the associated components.

According to the disclosed embodiment, a register file 122 is modeled to form an ATPG-compliant model 130 for use in the design hierarchy of FIG. 3 and that can be used by the automatic test pattern generation tool by generating a design model that simplifies the logical structure of the register file 122. As described in detail below, the design hierarchy of the register file 122 is partitioned such that the combinational logic of the device is moved to an external logic model, enabling the new device model to be tested as a new memory model by the ATPG tool, independently of the external logic model. This arrangement is particularly effective for testing the post processing logic 154, since the input generally would be unknown.

According to the disclosed embodiment, the register file 122 is modeled as a memory model, for example, a RAM. Once ATPG model 130 has been characterized as a RAM, the ATPG tool can use the model to generate a test pattern for testing of the register file based on the stored verified model 130 of the register file 122.

FIG. 5 is a diagram illustrating the method of transforming a register file (C) 122 into a model by partitioning the register file to create a model having a memory model and a separate logic model. A brief overview of the method will be first provided with reference to FIGS. 4A and 4B. The ATPG tool is able to recognize models associated with the logic 150 and the memory portion 152. However, the ATPG tool is not capable of providing inputs for the logic 154. Moreover, the ATPG tool is unable to generate inputs for characterizing the logic 170 and the logic 164 of FIG. 4B. With reference to FIG. 5, the ATPG tool would be unable to generate input vectors for the registers 174 (R1, R2 and R3) driven by the logic (A) 172.

Hence, the design hierarchy is partitioned such that all combinational logic inside the register file 122 is moved to external logic according to the mapping A[2]→A[1]+1, where A[1] is a location in the register file 122, A[2] is another location to be written to, and the expression "A[1]+1" represents the combinational logic.

Hence, as shown in FIG. 5, the combinational logic (A) 172 is moved outside the register file (C) 122 by defining a new memory model (C''') 180 recognizable by the ATPG tool that models operations of the registers 174 (R1, R2, R3). The partitioned register file (C') 178 also includes a logic model 182 separate from the memory model 180. Once the register file 122 has been partitioned into a second representation 178 having the memory model 180 and the separate logic model 182, the ATPG tool can be used to generate the ATPG model 500 ($M_{C'''}$) for the register file 122.

Once the model 500 has been generated by the standard mentor ATPG library tools, the model ($M_{C'''}$) is verified by actual gate level implementation. If the output of the model 500 matches the output of the actual gate implementation, then the accuracy of the model 500 is verified, enabling the verified model to be stored for future use.

Note that the logic (A) 172 in register file (C) 122 in FIG. 5 previously could not be tested. Since the internal logic (A) is moved external to register (C''') 180, the new model of (C''') enables testing of the logic 182, plus generation of a new ATPG model of register (C''') 180. Hence, the ATPG model of memory (C''') 180 includes input data (D), address (A), clock, data out and read/write (RE/WE). A test vector can now be generated for the ATPG model 500. For example, the following vector can be generated, Data D=101010, Address A=1010, WE=1. The vector also includes the time variable time t(0)=0, t(1)=1, t(2)=0 is used to generate an impulse, and the expected output to equal 101010. Appendix A is an illustration of a register file. For example, page A3 of the Appendix "registers for watermark" illustrates how the series of IF-THEN statements correspond to a single RAM. Appendix B illustrates models generated for the register module cq_oq1_reg.

Figure 6A:
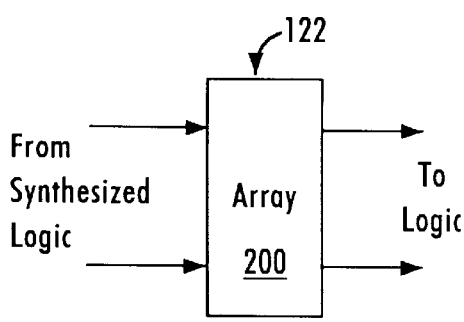
FIGS. 6A, 6B, 6C and 6D are diagrams illustrating alternative structures for testing selected portions of a register array represented by the register file according to an embodiment of the present invention.
Figure 6B:
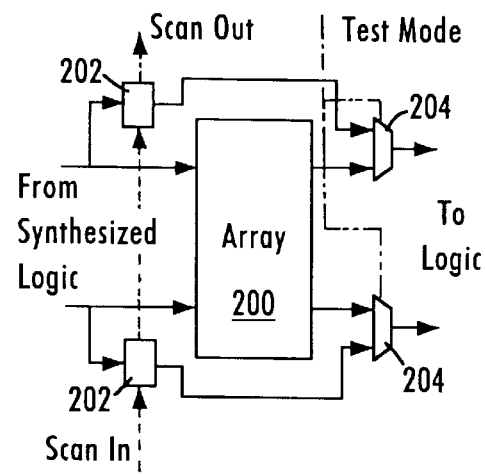
Figure 6C:
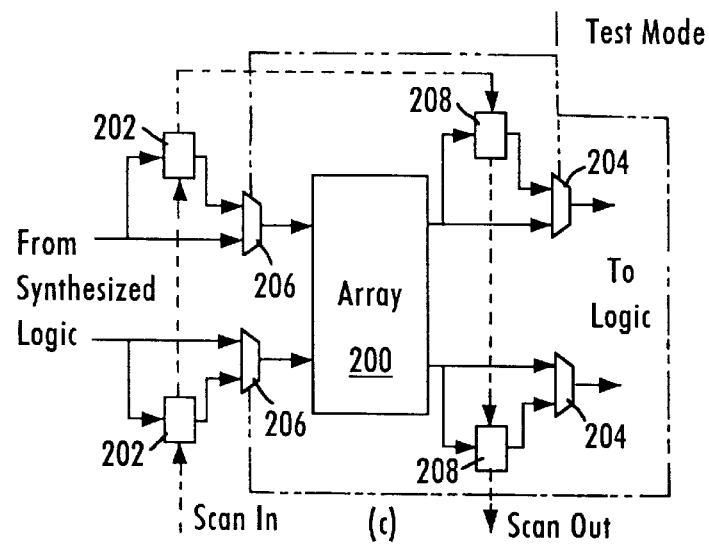

As described above, verification of the model requires a comparison with gate-level implementation. Hence, coordination is required between the modeling, strategy and physical implementation to ensure that design for test capabilities are integrated into the implementation hardware. FIGS. 6A, 6B and 6C illustrate a "black box" approach to testing the array 200.

For example, FIG. 6A is a diagram illustrating a hardware implementation of a register array 200. As shown in FIG. 6A, the array 200 receives inputs from synthesized logic (e.g., logic 150) and sends outputs to additional processing logic (e.g., logic 154). As described above with respect to the prior art, the internal operations of the array 200 are not known to the ATPG tool. Thus, any logic driving the array 200 or driven by the array would be typically untestable since faults in the logic driving the array are unobservable and faults in the logic driven by the array are uncontrollable. The faults can be testable if the entire array is surrounded by scan registers 202, shown in FIG. 6B, where data from the synthesized logic driving the array is observed in the scan chain during the test mode, and data from the scan chain is used to test the synthesized logic (e.g., logic 154) using multiplexers 204. FIG. 6C illustrates a more complex arrangement further including scan registers 208 and multiplexers 206, where the scan chain can be used in applying test vectors to the array 200 as well as testing the logic surrounding the array. To test the array, the read and write enable lines must be controllable.

Figure 6D:
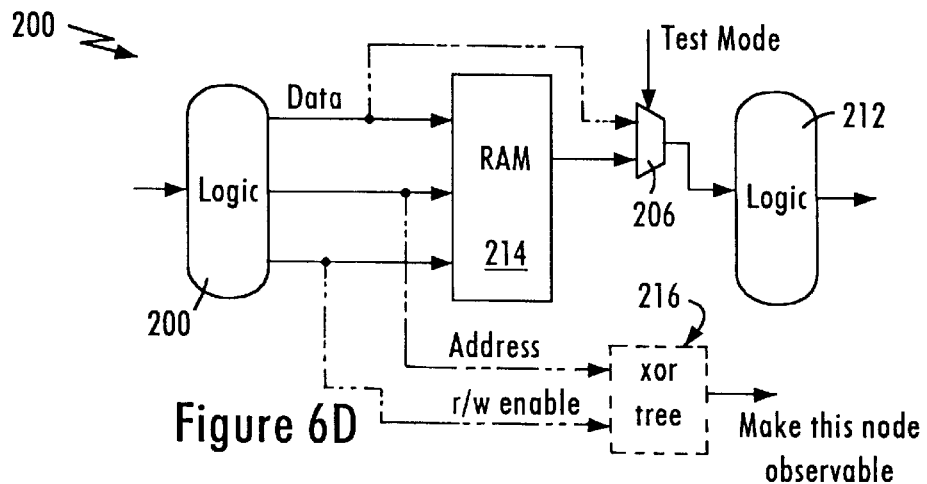

As shown in FIG. 6D, a bypass is added to the array 200 to enable testing of the logic portions 210 and 212 surrounding the RAM 214. Special test modes can thus be used to test the input/output of the array via the chip I/Os. Note that all address and read/write enable lines are connected to an XOR tree 216 that can be made observable by connecting its inputs to one or more scan flip-flops.

Figure 7:
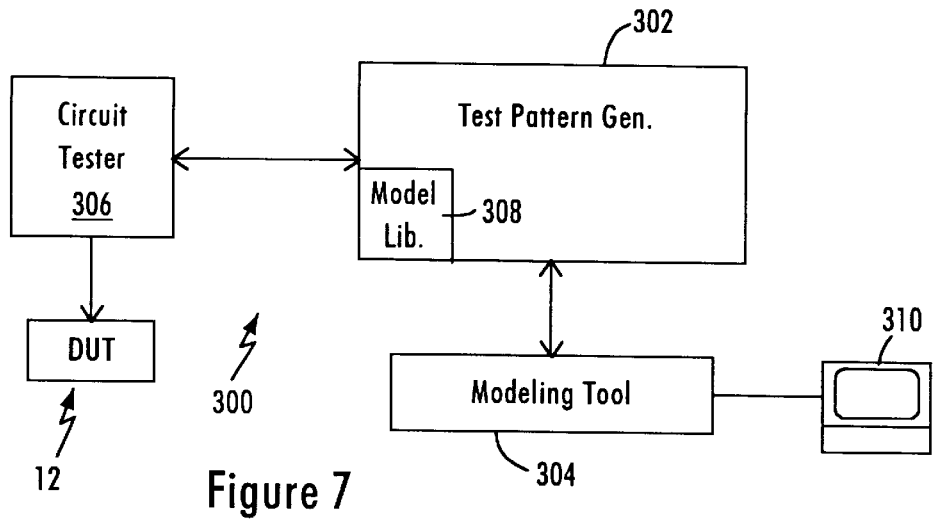
FIG. 7 is a block diagram illustrating a system for generating a model of the register file and for testing a device according to an embodiment of the present invention.

FIG. 7 is a block diagram illustrating the system according to an embodiment of the present invention. The system 300, which may be implemented as a computer system, includes a test pattern generation system 302, a modeling tool 304, and a circuit tester 306 configured for electrically interconnecting and testing a device under test, for example the multiport switch 12. The test pattern generator 302 is configured for generating test vectors for selected models stored in a model library 308. An example of the test pattern generator 302 is the Mentor Fastscan. The model library 308 stores memory models of predetermined memory components and logic models of prescribed logic circuits. The modeling tool 304 is an event-driven simulator configured for processing models simulating operation of a device, such as the device under test 12. An exemplary modeling tool 304 is the Verilag system, which receives instructions for partitioning from a user interface 310.

Once the modeling tool 304 has processed and generated models simulating how the device under test should work, the test pattern generation system 302 generates test vectors according to the models, and supplies the test vectors to the circuit tester 306. The circuit tester 306 processes the test vectors by supplying a test scan to the appropriate scan registers 202, for example as shown in FIGS. 6B, 6C and 6D, and drives the multiplexers 204 and 206 as necessary to bypass the internal logic surrounding a simulated register. A circuit tester 306 also recovers test results, for example from registers 208 or the exclusive XOR tree 216, and returns the actual results to the test pattern generator 302. Hence, the system 300 enables generation of models for simulating operation of the device under test 12, and enables verification of the models by generating test vectors to the device under test 12, as well as reading the results of the test vectors.

Figure 8:
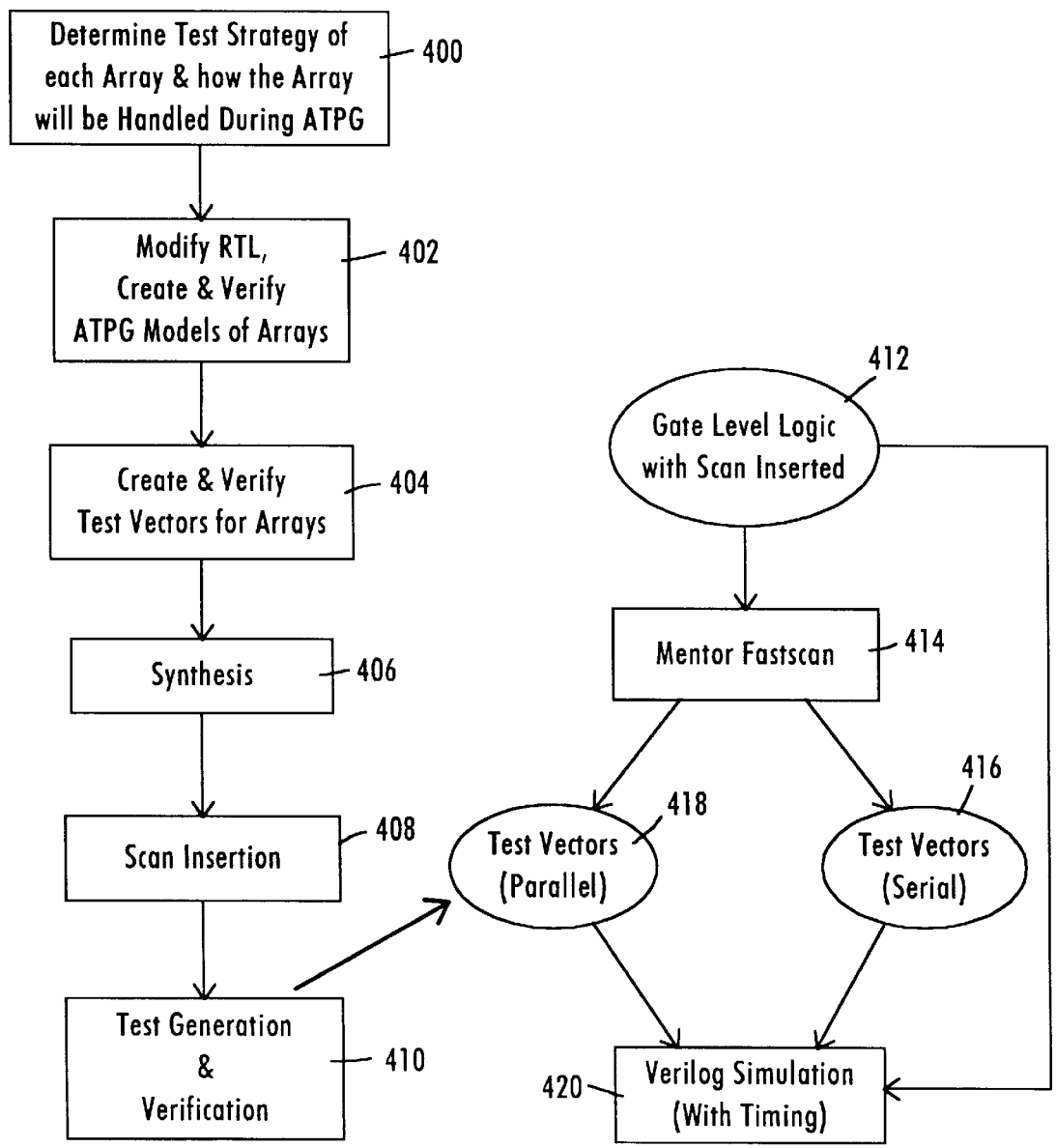
FIG. 8 is a flow diagram illustrating a method for performing design testing.

FIG. 8 is a flow diagram illustrating a method for performing design testing according to an embodiment of the present invention. As shown in FIG. 8, the method begins in step 400 by determining the test strategy of each array 200, and how the array will be handled during ATPG modeling. For example, the design hierarchy of the device under test should be evaluated relative to the hierarchy of FIG. 3, where use of preexisting ATPG models 110 are used when available. As described above, the classification of glue logic 108 should be avoided, rather the glue logic should be preferably incorporated into one of the other functional blocks 102, 104, or 106.

RAMs and register files are typically tested using checkerboard patterns. According to the disclosed embodiment, various data backgrounds are written and read to and from the device under test, using at least the following backgrounds: "0000 . . . ", "10101010 . . . ", and "11001100 . . . ". The width of the data background is based on the number of bits in a word of the array under consideration. If the number of bits in the word is 1, then only one data background is required.

The first stage is to fill the entire memory with a data background. The data background is then read starting from the first address, and the inverse background is then written to test for stuck-at faults in each memory cell as well as transition faults. In addition, since the current data read from the array is always the inverse of the data read during the previous read cycle, any stuck-open faults (in cases of RAMs that have output latches) are covered. Thus, if a RAM does not have output latches and the sense amplifiers are properly designed, the second read can be avoided. All coupling faults, read/write circuitry faults as well as faults in the address decoders are tested.

The test system can be implemented on-chip using dedicated test circuitry, such as built-in self test. If all the RAMs are accessible from the primary I/O or special test modes can be implemented such that the RAMs are accessible, the test algorithm can be applied using the chip I/Os. For synthesized logic, a full scan methodology should be used based on the level sensitive scan design technique.

Once the test strategy has been determined, the ATPG models of the arrays are then created in step 402, as described above. The test vectors are then created and verified in step 404 for the arrays based on the comparison between the models and the actual response from the physical device.

Once the test vectors have been verified for the arrays, the block synthesis is then performed in step 406, preferably using the synopsis DC-Expert Plus system, where the attributes are specified for scanned flip-flops instead of non-scanned flip-flops. Following synthesis of each block in step 406, scan insertion is then performed in step 408 to insert the scanned cells during the synthesis process.

After the models have been tested and verified in step 410, the models are stored in the library, followed by simulation of gate level logic in step 412. The Mentor Fastscan system is then used in step 414 to generate serial test factors in step 416 and parallel vectors in step 418. The test factors are then used to perform Verilag simulation with the appropriate time constraints in step 420.

According to the present invention, complex devices having relatively complex logical structures can be accurately modeled with 100% testability by generating appropriate design models, and causing conventional design tools to perform model simulation as if the complex design tool was a memory. Hence, logic normally untestable due to integral operations with a memory can be segregated and tested.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

Appendix A

```
// Description : Output Queue #1 PCI Host Access Registers

//--------------------------------------------------       ---------

'define      DLY_GLOBAL       3        // global delay
'define      PORT_NO          14       // no. of ports in EACH output queue
'define      PORT_WIDTH       4        // no. of bits for port no.
'define      WS_FIFO_SIZE     32       // 10 Mb/s WS FIFO size (frame ptr)
'define      WS_PTR_WIDTH     6        // bit width of WS pointer
'define      RS_FIFO_SIZE     16       // RS FIFO size
'define      RS_PTR_WIDTH     4        // bit width of RS pointer
'define      WS_THRESHOLD     4        // WS DMA threshold
'define      RS_THRESHOLD     4        // RS DMA threshold
'define      WS_ADDR_WIDTH    9        // bit width of WS FIFO address
'define      RS_ADDR_WIDTH    7        // bit width of RS FIFO address
'define      W_PI_AD          16       // bit width of PCI address
'define      W_PI_DATA        32       // bit widht of PCI data 'define      FIFO_WIDTH       32       // bit width of FIFO SRAM
'define      CQ_DATA_WIDTH    16       // bit width of CQ data bus
'define      PV_DATA_WIDTH    34       // bit width of PV data bus
'define      FRAME_PTR_WIDTH  16       // bit width of frame pointer 'define      ALL_PORT_NO      28       // totol no. of ports in OQ
'define      ALL_PORT_WIDTH   5        // bit width for all-port select 'define      STATE_NO         9        // no. of states in CQ state machine
'define      STATE_WIDTH      4        // bit width for state variable module cq_oq1_reg (
            clk80,
            rst,
            g_rg_data,
            mk_reg_state,
            mk_reg_dec,
            ws_frm_inc,
            ws_sel_out_1,
            rs_frm_dec,
            rs_sel_out_1,
            cn_inc_data,
            cn_dec_data,
            cn_reg_state,
            cn_dec_sel, hi_mrk_1,
            lo_mrk_1,
            hi_mrk_25,
            lo_mrk_25,
            hi_mrk_26,
            lo_mrk_26,
            cq_indx_reg,
            cn_pi_data,
            cn_ws_reg,
            cn_rs_reg
            );
```

A-1

```
parameter           DLY = 'DLY_GLOBAL;
parameter           PORT_N = 'PORT_NO;
parameter           PORT_W = 'PORT_WIDTH;
parameter           PORT_MAX = PORT_N - 1;

parameter           WS_ADDR_W = 'WS_ADDR_WIDTH;
parameter           RS_ADDR_W = 'RS_ADDR_WIDTH;
parameter           WS_PTR_MAX = 'WS_FIFO_SIZE - 1;
parameter           WS_PTR_W = 'WS_PTR_WIDTH;
parameter           RS_PTR_MAX = 'RS_FIFO_SIZE - 1;
parameter           RS_PTR_W = 'RS_PTR_WIDTH;
parameter           W_PI_AD = 'W_PI_AD;
parameter           W_PI_DATA = 'W_PI_DATA;

parameter           FIFO_W = 'FIFO_WIDTH;
parameter           FIFO_W_2 = FIFO_W/2;
parameter           CQ_DATA_W = 'CQ_DATA_WIDTH;
parameter           PV_DATA_W = 'PV_DATA_WIDTH;
parameter           FRAME_PTR_W = 'FRAME_PTR_WIDTH;

parameter           ALL_PORT_NO = 'ALL_PORT_NO;
parameter           ALL_PORT_W = 'ALL_PORT_WIDTH;

parameter           STATE_N = 'STATE_NO;
parameter           STATE_W = 'STATE_WIDTH;

// state machine parameter
parameter [1:0]
                IDLE    = 2'b00,
                WRITE   = 2'b01,
                READ1   = 2'b10,
                READ2   = 2'b11;

input                       clk80;              // 80 MHz system clock
input                       rst;                // system reset
input    [W_PI_DATA-1:0]    g_rg_data;          // PCI reg file data bus
input    [1:0]              mk_reg_state;       // watermart state
input    [3:0]              mk_reg_dec;         // watermark decoded reg addr
input                       ws_frm_inc;         // WS frame count increment signal
input    [PORT_W-1:0]       ws_sel_out_1;       // delayed WS select
input                       rs_frm_dec;         // RS frame count decrement signal
input    [PORT_W-1:0]       rs_sel_out_1;       // delayed RS select
input    [15:0]             cn_inc_data;        // frame counter incremented data
input    [15:0]             cn_dec_data;        // frame counter decremented data
input    [1:0]              cn_reg_state;       // frame counter state
input    [3:0]              cn_dec_sel;         // frame counter reg addr output   [13:0]             hi_mrk_1;           // Hi Watermark for 10M Ports
output   [13:0]             lo_mrk_1;           // Low Watermark for 10M Ports
output   [13:0]             hi_mrk_25;          // Low Watermark for port 25
output   [13:0]             lo_mrk_25;          // Low Watermark for port 25
output   [13:0]             hi_mrk_26;          // Low Watermark for port 26
output   [13:0]             lo_mrk_26;          // Low Watermark for port 26
output   [7:0]              cq_indx_reg;        // Diagnostic Array Index
output   [W_PI_DATA-1:0]    cn_pi_data;         // OQ frame count to PCI data
output   [15:0]             cn_ws_reg;          // WS selected frame counter
output   [15:0]             cn_rs_reg;          // RS selected frame counter wire     [W_PI_DATA-1:0]    g_rg_data;
wire     [1:0]              mk_reg_state;
wire     [3:0]              mk_reg_dec;
wire     [PORT_W-1:0]       ws_sel_out_1;
```

A-2

```verilog
wire    [PORT_W-1:0]    rs_se   ut_1;
wire    [15:0]          cn_inc_data;
wire    [15:0]          cn_dec_data;
wire    [1:0]           cn_reg_state;
wire    [3:0]           cn_dec_sel;
wire    [15:0]          cn_ws_reg;
wire    [15:0]          cn_rs_reg;

//Back Pressure Threshold Registers
reg     [13:0]          hi_mrk_1;
reg     [13:0]          lo_mrk_1;
reg     [13:0]          hi_mrk_25;
reg     [13:0]          lo_mrk_25;
reg     [13:0]          hi_mrk_26;
reg     [13:0]          lo_mrk_26;

//Diagnostic Memory Array Index Pointer
reg     [7:0]           cq_indx_reg;

// OQ Frame Pointer Counter Registers
reg     [15:0]          frm_cnt[PORT_N-1:0];

wire    [W_PI_DATA-1:0] cn_pi_data;     // OQ frame count to PCI data integer                 i;

/* ---------------------------------------------------------------------- */
// Registers for Watermark always @(posedge clk80 or posedge rst)
begin
        if (rst)
                begin
                hi_mrk_1  <= #DLY 14'b0;
                lo_mrk_1  <= #DLY 14'b0;
                hi_mrk_25 <= #DLY 14'b0;
                lo_mrk_25 <= #DLY 14'b0;
                hi_mrk_26 <= #DLY 14'b0;
                lo_mrk_26 <= #DLY 14'b0;
                cq_indx_reg <= #DLY 7'b0;
                end else
                begin
                if (mk_reg_state == WRITE)
                        casex (mk_reg_dec)              // $s parallel_case
                        4'bxxx1:
                                begin
                                hi_mrk_1 <= #DLY g_rg_data[29:16];
                                lo_mrk_1 <= #DLY g_rg_data[13:0];
                                end
                        4'bxx1x:
                                begin
                                hi_mrk_25 <= #DLY g_rg_data[29:16];
                                lo_mrk_25 <= #DLY g_rg_data[13:0];
                                end
                        4'bx1xx:
                                begin
                                hi_mrk_26 <= #DLY g_rg_data[29:16];
                                lo_mrk_26 <= #DLY g_rg_data[13:0];
                                end
                        4'b1xxx:
                                begin
                                cq_indx_reg <= #DLY g_rg_data[7:0];
```

A-3

```
                                end
                        endcase
                end
end /* ---------------------------------------------------------------------- */
// Registers for Frame Pointer Counter // Update Frame Counter from WS/RS Control
always @(posedge clk80 or posedge rst)
begin
        if (rst)
                for (i=0; i<PORT_N; i=i+1)
                        frm_cnt[i] <= #DLY 16'b0;
        else if (ws_frm_inc)
                frm_cnt[ws_sel_out_1] <= #DLY cn_inc_data;
        else if (rs_frm_dec)
                frm_cnt[rs_sel_out_1] <= #DLY cn_dec_data;
        else if (cn_reg_state==WRITE)
                frm_cnt[cn_dec_sel] <= #DLY g_rg_data[15:0];
end assign  cn_ws_reg = frm_cnt[ws_sel_out_1];
assign  cn_rs_reg = frm_cnt[rs_sel_out_1];

// Output PCI bus MUX
assign  cn_pi_data = {16'b0, frm_cnt[cn_dec_sel]};

endmodule

// $s translate_off
'undef PORT_NO
// $s translate_on
```

A-4

*Appendix B*

```
model cq_oq1_reg_a1 (rst, clk80, ADD, mk_reg_state, data_in, data_out) ( input (ADD, rst, clk80) ()
  input (data_in) (array = 27:0;)
  input (mk_reg_state) (array = 1:0;)
  intern (WE) (function = !mk_reg_state<1> * mk_reg_state<0>; fault = none;)
  output (data_out) (
    array = 27:0;
    data_size = 28;
    address_size = 1;
    edge_trigger = w;
    write_contention = true;
    read_write_conflict = ow;
    address_type = decode;
    primitive = _cram(,rst,
      _write(H,H,H) (clk80, WE, ADD, data_in),
      _read(,,,) (,,, ADD, data_out)
    );
  )
)

model cq_oq1_reg_a2 (rst, clk80, ADD, mk_reg_state, data_in, data_out) ( input (ADD, rst, clk80) ()
  input (data_in) (array = 7:0;)
  input (mk_reg_state) (array = 1:0;)
  intern (WE) (function = !mk_reg_state<1> * mk_reg_state<0>; fault = none;)
  output (data_out) (
    array = 7:0;
    data_size = 8;
    address_size = 1;
    edge_trigger = w;
    read_write_conflict = ow;
    write_contention = true;
    address_type = decode;
    primitive = _cram(,rst,
      _write(H,H,H) (clk80, WE, ADD, data_in),
      _read(,,,) (,,, ADD, data_out)
    );
  )
)

model cq_oq1_reg_a (rst:nf, clk80:nf, mk_reg_state:nf, g_rg_data:nf,
                   mk_reg_dec:nf, hi_mrk_1:nf, lo_mrk_1:nf, hi_mrk_25:nf,
                   lo_mrk_25:nf, hi_mrk_26:nf, lo_mrk_26:nf, cq_indx_reg:nf) ( input (rst, clk80) ()
  input (mk_reg_state) (array = 1:0;)
  input (g_rg_data) (array = 31:0;)
  input (mk_reg_dec) (array = 3:0;)
  intern (data_in) ( array = 27:0;
    fault = none;
    primitive = _wire(g_rg_data<0>, data_in<0>);
    primitive = _wire(g_rg_data<1>, data_in<1>);
    primitive = _wire(g_rg_data<2>, data_in<2>);
    primitive = _wire(g_rg_data<3>, data_in<3>);
    primitive = _wire(g_rg_data<4>, data_in<4>);
    primitive = _wire(g_rg_data<5>, data_in<5>);
    primitive = _wire(g_rg_data<6>, data_in<6>);
    primitive = _wire(g_rg_data<7>, data_in<7>);
    primitive = _wire(g_rg_data<8>, data_in<8>);
    primitive = _wire(g_rg_data<9>, data_in<9>);
    primitive = _wire(g_rg_data<10>, data_in<10>);
    primitive = _wire(g_rg_data<11>, data_in<11>);
    primitive = _wire(g_rg_data<12>, data_in<12>);
```

B-1

```
      primitive = _wire(g_rg_data<13>, data_in<13>);
      primitive = _wire(g_rg_dat   6>, data_in<14>);
      primitive = _wire(g_rg_data<17>, data_in<15>);
      primitive = _wire(g_rg_data<18>, data_in<16>);
      primitive = _wire(g_rg_data<19>, data_in<17>);
      primitive = _wire(g_rg_data<20>, data_in<18>);
      primitive = _wire(g_rg_data<21>, data_in<19>);
      primitive = _wire(g_rg_data<22>, data_in<20>);
      primitive = _wire(g_rg_data<23>, data_in<21>);
      primitive = _wire(g_rg_data<24>, data_in<22>);
      primitive = _wire(g_rg_data<25>, data_in<23>);
      primitive = _wire(g_rg_data<26>, data_in<24>);
      primitive = _wire(g_rg_data<27>, data_in<25>);
      primitive = _wire(g_rg_data<28>, data_in<26>);
      primitive = _wire(g_rg_data<29>, data_in<27>);
  )
  intern (data_out0) (
    array = 27:0;
    instance = cq_oq1_reg_a1 (rst, clk80, mk_reg_dec<0>, mk_reg_state,
                              data_in, data_out0);
  )
  intern (data_out1) (
    array = 27:0;
    instance = cq_oq1_reg_a1 (rst, clk80, mk_reg_dec<1>, mk_reg_state,
                              data_in, data_out1);
  )
  intern (data_out2) (
    array = 27:0;
    instance = cq_oq1_reg_a1 (rst, clk80, mk_reg_dec<2>, mk_reg_state,
                              data_in, data_out2);
  )
  output (cq_indx_reg) (
    array = 7:0;
    instance = cq_oq1_reg_a2 (rst, clk80, mk_reg_dec<3>, mk_reg_state,
                              g_rg_data<7:0>, cq_indx_reg);
  )
  output (hi_mrk_1) (
    array = 13:0;
    primitive = _wire(data_out0<27>, hi_mrk_1<13>);
    primitive = _wire(data_out0<26>, hi_mrk_1<12>);
    primitive = _wire(data_out0<25>, hi_mrk_1<11>);
    primitive = _wire(data_out0<24>, hi_mrk_1<10>);
    primitive = _wire(data_out0<23>, hi_mrk_1<9>);
    primitive = _wire(data_out0<22>, hi_mrk_1<8>);
    primitive = _wire(data_out0<21>, hi_mrk_1<7>);
    primitive = _wire(data_out0<20>, hi_mrk_1<6>);
    primitive = _wire(data_out0<19>, hi_mrk_1<5>);
    primitive = _wire(data_out0<18>, hi_mrk_1<4>);
    primitive = _wire(data_out0<17>, hi_mrk_1<3>);
    primitive = _wire(data_out0<16>, hi_mrk_1<2>);
    primitive = _wire(data_out0<15>, hi_mrk_1<1>);
    primitive = _wire(data_out0<14>, hi_mrk_1<0>);
  )
  output (lo_mrk_1) (
    array = 13:0;
    primitive = _wire(data_out0<13>, lo_mrk_1<13>);
    primitive = _wire(data_out0<12>, lo_mrk_1<12>);
    primitive = _wire(data_out0<11>, lo_mrk_1<11>);
    primitive = _wire(data_out0<10>, lo_mrk_1<10>);
    primitive = _wire(data_out0<9>, lo_mrk_1<9>);
    primitive = _wire(data_out0<8>, lo_mrk_1<8>);
    primitive = _wire(data_out0<7>, lo_mrk_1<7>);
    primitive = _wire(data_out0<6>, lo_mrk_1<6>);
    primitive = _wire(data_out0<5>, lo_mrk_1<5>);
    primitive = _wire(data_out0<4>, lo_mrk_1<4>);
    primitive = _wire(data_out0<3>, lo_mrk_1<3>);
```

B-2

```
      primitive = _wire(data_out  ?>, lo_mrk_1<2>);
      primitive = _wire(data_out  1>, lo_mrk_1<1>);
      primitive = _wire(data_out0<0>, lo_mrk_1<0>);
  )
  output (hi_mrk_25) (
    array = 13:0;
      primitive = _wire(data_out1<27>, hi_mrk_25<13>);
      primitive = _wire(data_out1<26>, hi_mrk_25<12>);
      primitive = _wire(data_out1<25>, hi_mrk_25<11>);
      primitive = _wire(data_out1<24>, hi_mrk_25<10>);
      primitive = _wire(data_out1<23>, hi_mrk_25<9>);
      primitive = _wire(data_out1<22>, hi_mrk_25<8>);
      primitive = _wire(data_out1<21>, hi_mrk_25<7>);
      primitive = _wire(data_out1<20>, hi_mrk_25<6>);
      primitive = _wire(data_out1<19>, hi_mrk_25<5>);
      primitive = _wire(data_out1<18>, hi_mrk_25<4>);
      primitive = _wire(data_out1<17>, hi_mrk_25<3>);
      primitive = _wire(data_out1<16>, hi_mrk_25<2>);
      primitive = _wire(data_out1<15>, hi_mrk_25<1>);
      primitive = _wire(data_out1<14>, hi_mrk_25<0>);
  )
  output (lo_mrk_25) (
    array = 13:0;
      primitive = _wire(data_out1<13>, lo_mrk_25<13>);
      primitive = _wire(data_out1<12>, lo_mrk_25<12>);
      primitive = _wire(data_out1<11>, lo_mrk_25<11>);
      primitive = _wire(data_out1<10>, lo_mrk_25<10>);
      primitive = _wire(data_out1<9>, lo_mrk_25<9>);
      primitive = _wire(data_out1<8>, lo_mrk_25<8>);
      primitive = _wire(data_out1<7>, lo_mrk_25<7>);
      primitive = _wire(data_out1<6>, lo_mrk_25<6>);
      primitive = _wire(data_out1<5>, lo_mrk_25<5>);
      primitive = _wire(data_out1<4>, lo_mrk_25<4>);
      primitive = _wire(data_out1<3>, lo_mrk_25<3>);
      primitive = _wire(data_out1<2>, lo_mrk_25<2>);
      primitive = _wire(data_out1<1>, lo_mrk_25<1>);
      primitive = _wire(data_out1<0>, lo_mrk_25<0>);
  )
  output (hi_mrk_26) (
    array = 13:0;
      primitive = _wire(data_out2<27>, hi_mrk_26<13>);
      primitive = _wire(data_out2<26>, hi_mrk_26<12>);
      primitive = _wire(data_out2<25>, hi_mrk_26<11>);
      primitive = _wire(data_out2<24>, hi_mrk_26<10>);
      primitive = _wire(data_out2<23>, hi_mrk_26<9>);
      primitive = _wire(data_out2<22>, hi_mrk_26<8>);
      primitive = _wire(data_out2<21>, hi_mrk_26<7>);
      primitive = _wire(data_out2<20>, hi_mrk_26<6>);
      primitive = _wire(data_out2<19>, hi_mrk_26<5>);
      primitive = _wire(data_out2<18>, hi_mrk_26<4>);
      primitive = _wire(data_out2<17>, hi_mrk_26<3>);
      primitive = _wire(data_out2<16>, hi_mrk_26<2>);
      primitive = _wire(data_out2<15>, hi_mrk_26<1>);
      primitive = _wire(data_out2<14>, hi_mrk_26<0>);
  )
  output (lo_mrk_26) (
    array = 13:0;
      primitive = _wire(data_out2<13>, lo_mrk_26<13>);
      primitive = _wire(data_out2<12>, lo_mrk_26<12>);
      primitive = _wire(data_out2<11>, lo_mrk_26<11>);
      primitive = _wire(data_out2<10>, lo_mrk_26<10>);
      primitive = _wire(data_out2<9>, lo_mrk_26<9>);
      primitive = _wire(data_out2<8>, lo_mrk_26<8>);
      primitive = _wire(data_out2<7>, lo_mrk_26<7>);
      primitive = _wire(data_out2<6>, lo_mrk_26<6>);
      primitive = _wire(data_out2<5>, lo_mrk_26<5>);
```

B-3

```
         primitive = _wire(data_out  1>, lo_mrk_26<4>);
         primitive = _wire(data_out  3>, lo_mrk_26<3>);
         primitive = _wire(data_out2<2>, lo_mrk_26<2>);
         primitive = _wire(data_out2<1>, lo_mrk_26<1>);
         primitive = _wire(data_out2<0>, lo_mrk_26<0>);
   ).
)

model cq_oql_regb1 (clk80, rst, cn_reg_state, cn_dec_sel, g_rg_data,
                    cn_pi_data, ws_frm_inc, ws_sel_out_1, cn_inc_data,
                    rs_frm_dec, rs_sel_out_1, cn_dec_data, cn_ws_reg,
                    cn_rs_reg) ( input (clk80, rst, ws_frm_inc, rs_frm_dec) ()
   input (ws_sel_out_1, rs_sel_out_1, cn_dec_sel) (array = 3:0;)
   input (g_rg_data, cn_dec_data, cn_inc_data) (array = 15:0;)
   input (cn_reg_state) (array = 1:0;)
   intern (WE) (function = !cn_reg_state<1> * cn_reg_state<0>;)
   output (cn_pi_data, cn_rs_reg, cn_ws_reg) (
      fault = none;
      array = 15:0;
      data_size = 16;
      address_size = 4;
      min_address = 0;
      max_address = 13;
      edge_trigger = w;
      address_type = encode;
      write_contention = true;
      read_read_conflict = R;
      read_write_conflict = OW;
      overwrite = false;
      primitive = _cram(,rst,
         _write(H,H,H) (clk80, WE, cn_dec_sel, g_rg_data),
         _write(H,H,H) (clk80, ws_frm_inc, ws_sel_out_1, cn_inc_data),
         _write(H,H,H) (clk80, rs_frm_dec, rs_sel_out_1, cn_dec_data),
         _read(,,,) (,,, cn_dec_sel, cn_pi_data),
         _read(,,,) (,,, ws_sel_out_1, cn_ws_reg),
         _read(,,,) (,,, rs_sel_out_1, cn_rs_reg)
      );
   )
)

model cq_oql_regb (clk80:nf, rst:nf, cn_reg_state:nf, cn_dec_sel, g_rg_data:nf,
                   cn_pi_data:nf, ws_frm_inc:nf, ws_sel_out_1:nf, cn_inc_data:nf,
                   rs_frm_dec:nf, rs_sel_out_1:nf, cn_dec_data:nf, cn_ws_reg:nf,
                   cn_rs_reg:nf) ( input (clk80, rst, ws_frm_inc, rs_frm_dec) ()
   input (ws_sel_out_1, rs_sel_out_1, cn_dec_sel) (array = 3:0;)
   input (cn_reg_state) (array = 1:0;)
   input (g_rg_data) (array = 15:0;)
   input (cn_inc_data, cn_dec_data) (array = 15:0;)
   output (cn_ws_reg, cn_rs_reg) (array = 15:0;)
   output (cn_pi_data) (
      array = 31:0;
      instance = cq_oql_regb1 (clk80, rst, cn_reg_state, cn_dec_sel,
                               g_rg_data, cn_pi_data<15:0>, ws_frm_inc,
                               ws_sel_out_1, cn_inc_data, rs_frm_dec,
                               rs_sel_out_1, cn_dec_data, cn_ws_reg, cn_rs_reg);
      primitive = _tie0(cn_pi_data<16>);
      primitive = _tie0(cn_pi_data<17>);
      primitive = _tie0(cn_pi_data<18>);
      primitive = _tie0(cn_pi_data<19>);
      primitive = _tie0(cn_pi_data<20>);
      primitive = _tie0(cn_pi_data<21>);
      primitive = _tie0(cn_pi_data<22>);
```

B-4

```
      primitive = _tie0(cn_pi_data<23>);
      primitive = _tie0(cn_pi_data<24>);
      primitive = _tie0(cn_pi_data<25>);
      primitive = _tie0(cn_pi_data<26>);
      primitive = _tie0(cn_pi_data<27>);
      primitive = _tie0(cn_pi_data<28>);
      primitive = _tie0(cn_pi_data<29>);
      primitive = _tie0(cn_pi_data<30>);
      primitive = _tie0(cn_pi_data<31>);
   )
)

model cq_oq1_reg (clk80, rst, g_rg_data, mk_reg_state, mk_reg_dec,
                  ws_frm_inc, ws_sel_out_1, rs_frm_dec, rs_sel_out_1,
                  cn_inc_data, cn_dec_data, cn_reg_state, cn_dec_sel,
                  hi_mrk_1, lo_mrk_1, hi_mrk_25, lo_mrk_25, hi_mrk_26,
                  lo_mrk_26, cq_indx_reg, cn_pi_data, cn_ws_reg,
                  cn_rs_reg) ( input (clk80, rst, ws_frm_inc, rs_frm_dec) ()
   input (g_rg_data) (array = 31:0;)
   input (mk_reg_state, cn_reg_state) (array = 1:0;)
   input (mk_reg_dec, ws_sel_out_1, rs_sel_out_1, cn_dec_sel) (array = 3:0;)
   input (cn_inc_data, cn_dec_data) (array = 15:0;)
   output (hi_mrk_1, lo_mrk_1, hi_mrk_25, lo_mrk_25, hi_mrk_26, lo_mrk_26) (
         array = 13:0;)
   output (cq_indx_reg) (array = 7:0;)
   output (cn_ws_reg, cn_rs_reg) (array = 15:0;)
   output (cn_pi_data) (
      array = 31:0;
      instance = cq_oq1_reg_a (rst:nf, clk80:nf, mk_reg_state:nf, g_rg_data:nf,
                               mk_reg_dec:nf, hi_mrk_1:nf, lo_mrk_1:nf,
                               hi_mrk_25:nf, lo_mrk_25:nf,
                               hi_mrk_26:nf, lo_mrk_26:nf, cq_indx_reg:nf);
      instance = cq_oq1_regb (clk80:nf, rst:nf, cn_reg_state:nf, cn_dec_sel:nf,
                              g_rg_data<15:0>:nf, cn_pi_data:nf, ws_frm_inc:nf,
                              ws_sel_out_1:nf, cn_inc_data:nf, rs_frm_dec,
                              rs_sel_out_1:nf, cn_dec_data:nf, cn_ws_reg:nf,
                              cn_rs_reg:nf);
   )
)

model cq_oq1_reg_c (rst, clk80, mb_reg_state, mb_reg_dec, eb_ena_reg,
                    g_rg_data) ( input (rst, clk80, mb_reg_dec, g_rg_data) ()
   input (mb_reg_state) (array = 1:0;)
   intern (WE) (function = !mb_reg_state<1> * mb_reg_state<0>;)
   output (eb_ena_reg) (
      data_size = 1;
      address_size = 1;
      address_type = decode;
      edge_trigger = w;
//    read_write_conflict = NW;
      primitive = _cram(, rst,
         _write(H,H,H) (clk80, WE, mb_reg_dec, g_rg_data),
         _read(,,,) (,,, mb_reg_dec, eb_ena_reg)
      );
   )
)

model cq_oq2_reg(clk80, rst, g_rg_data, mk_reg_state, mk_reg_dec, ws_frm_inc,
                 ws_sel_out_1, rs_frm_dec, rs_sel_out_1, cn_inc_data, cn_dec_data,
                 cn_reg_state, cn_dec_sel, mb_reg_state, mb_reg_dec, hi_mrk_1,
```

B-5

```
              lo_mrk_1, hi_mrk_25, lo_mrk_25, hi_mrk_26, lo_mrk_26,
              cq_indx_reg, cn_pi_data, cn_ws_reg, cn_rs_reg, eb_ena_reg,
              mg_ena_reg) (
input (clk80, rst, ws_frm_inc, rs_frm_dec) ()
input (g_rg_data) (array = 31:0;)
input (mk_reg_state, cn_reg_state, mb_reg_state) (array = 1:0;)
input (mk_reg_dec, ws_sel_out_1, rs_sel_out_1, cn_dec_sel,
       mb_reg_dec) (array = 3:0;)
input (cn_inc_data, cn_dec_data) (array = 15:0;)
output (hi_mrk_1, lo_mrk_1, hi_mrk_25, lo_mrk_25, hi_mrk_26,
        lo_mrk_26) (array = 13:0;)
output (cq_indx_reg) (array = 7:0;)
output (cn_ws_reg, cn_rs_reg) (array = 15:0;)
output (eb_ena_reg, mg_ena_reg) ()
output (cn_pi_data) (
  array = 31:0;
  instance = cq_oq1_reg_a (rst:nf, clk80:nf, mk_reg_state:nf, g_rg_data:nf,
                           mk_reg_dec:nf, hi_mrk_1:nf, lo_mrk_1:nf,
                           hi_mrk_25:nf, lo_mrk_25:nf,
                           hi_mrk_26:nf, lo_mrk_26:nf, cq_indx_reg:nf);
  instance = cq_oq1_regb (clk80:nf, rst:nf, cn_reg_state:nf, cn_dec_sel:nf,
                          g_rg_data<15:0>:nf, cn_pi_data:nf, ws_frm_inc:nf,
                          ws_sel_out_1:nf, cn_inc_data:nf, rs_frm_dec,
                          rs_sel_out_1:nf, cn_dec_data:nf, cn_ws_reg:nf,
                          cn_rs_reg:nf);
  instance = cq_oq1_reg_c (rst:nf, clk80:nf, mb_reg_state:nf, mb_reg_dec<1>:nf,
                           eb_ena_reg:nf, g_rg_data<0>:nf);
  instance = cq_oq1_reg_c (rst:nf, clk80:nf, mb_reg_state:nf, mb_reg_dec<3>:nf,
                           mg_ena_reg:nf, g_rg_data<0>:nf);
)
)
```

What is claimed is:

1. A method for testing a device, comprising:

modeling a device design based on a prescribed hierarchy used by a test pattern generation system, the device design including a register file comprising a memory portion and an associated logic portion integral with the memory portion, the modeling step including partitioning the register file to create a model of the register file having a memory model recognizable by the test pattern generation system and having an accessible input and an accessible output, and a logic model separate from the memory model;

verifying the model of the register file as an accurate representation of the register file based on prescribed test patterns;

storing the verified model of the register file in the test pattern generation system, said the storing including storing the verified model of the register file in an Automatic Test Pattern Generation (ATPG) tool; and generating in the ATPG tool a test pattern for testing of the register file based on the stored verified model of the register file, wherein the test pattern generating test comprises generating a test vector as said test pattern, the test vector including a data vector, an address vector, a timing vector, and an expected output vector.

2. A method for testing a device, comprising:

modeling a device design based on a prescribed hierarchy used by a test pattern generation system, the device design including a register file comprising a memory portion and an associated logic portion integral with the memory portion, the modeling step including partitioning the register file to create a model of the register file having a memory model recognizable by the test pattern generation system and having an accessible input and an accessible output, and a logic model separate from the memory model;

verifying the model of the register file as an accurate representation of the register file based on prescribed test patterns; and storing the verified model of the register file in the test pattern generation system, wherein the modeling step further comprises:
  separating the device design into functional components; and
  assigning each of the functional components according to the prescribed hierarchy into one of a memory class, a processor class, and a passive combinational logic class.

3. A method for testing a device, comprising:

modeling a device design based on a prescribed hierarchy used by a test pattern generation system, the device design including a register file comprising a memory portion and an associated logic portion integral with the memory portion, the modeling step including partitioning the register file to create a model of the register file having a memory model recognizable by the test pattern generation system and having an accessible input and an accessible output, and a logic model separate from the memory model;

verifying the model of the register file as an accurate representation of the register file based on prescribed test patterns; and storing the verified model of the register file in the test pattern generation system, wherein the verifying step comprises:

first supplying the prescribed test patterns to the model of the register file;

second supplying the prescribed test patterns to a physical implementation of the register file; and comparing outputs of the model of the register file and the physical implementation of the register file.

4. The method of claim 3, wherein the second supplying step comprises:

providing selectable test paths within the physical implementation of the register file, the selectable test paths providing input and output paths between a logical portion of the physical implementation and a memory portion of the physical implementation; and supplying the prescribed test patterns on a first selected test path; and reading an output from the physical implementation from a second selected test path, the first and selected test paths bypassing at least one of the logical portion and the memory portion of the physical implementation.

5. A method for testing a device, comprising:

modeling a device design based on a prescribed hierarchy used by a test pattern generation system, the device design including a register file comprising a memory portion and an associated logic portion integral with the memory portion, the modeling step including partitioning the register file to create a model of the register file having a memory model recognizable by the test pattern generation system and having an accessible input and an accessible output, and a logic model separate from the memory model;

verifying the model of the register file as an accurate representation of the register file based on prescribed test patterns; and storing the verified model of the register file in the test pattern generation system, wherein the device is a multiport switch for use in a packet switched network, the multiport switch having a PCI interface and switch configuration registers addressable via the PCI interface by one of a direct address space and an indirect address space, the modeling step comprising generating, for each of said configuration registers, the corresponding memory model and the corresponding logic model specifying a corresponding addressing logic.

6. A system comprising:

a test pattern generation system configured for generating test vectors for selected models, the test pattern generation system having a model library configured for storing memory models of respective predetermined memory components and logic models of prescribed logic circuits, respectively;

a modeling tool configured for modeling a device design of a hardware device, the device design including a register file representing an addressable register in the hardware device, the register file having integrally associated logic, the modeling tool being configured to partition the register file to create a model of the register file having a memory model recognizable by the test pattern generation system and having an accessible input and an accessible output, and a logic model separate from the memory model, the modeling tool storing the model of the register file in the model library for generation of respective test vectors by the test pattern generation system; and a circuit tester configured for supplying test signals on first selected test paths of the device in response to the generated test vectors, the circuit tester reading test results from second selected test paths of the device based on the generated test vectors.

7. The system of claim 6, wherein the modeling tool verifying the model of the register file is based on the read test results relative to the generated test vectors.

8. A system comprising:

an event-driven simulator configured for processing models simulating operation of a device, one of the models including a register file having a memory portion and an associated logic portion integral with the memory portion, the event-driven simulator having a partitioning module configured for separating the logic portion from the memory portion;

a test pattern generation system configured for generating test vectors for selected models, the test pattern generating system interpreting the register file as the memory portion, separate from the logic portion, in response to an interpret command from the event-driven simulator; and a circuit tester configured for supplying test signals on first selected test paths of the device in response to the generated test vectors, the circuit tester reading test results from second selected test paths of the device based on the generated test vectors.

* * * * *